(12) United States Patent
Wu

(10) Patent No.: US 10,020,404 B1
(45) Date of Patent: Jul. 10, 2018

(54) VERTICAL FLASH MEMORY AND FORMING METHOD THEREOF

(71) Applicant: UNITED MICROELECTRONICS CORP., Hsin-Chu (TW)

(72) Inventor: Tsung-Lin Wu, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/498,491

(22) Filed: Apr. 27, 2017

(51) Int. Cl.
| | |
|---|---|
| *H01L 29/792* | (2006.01) |
| *H01L 27/115* | (2017.01) |
| *H01L 27/1157* | (2017.01) |
| *H01L 27/11565* | (2017.01) |
| *H01L 23/522* | (2006.01) |
| *H01L 23/528* | (2006.01) |
| *H01L 21/28* | (2006.01) |

(52) U.S. Cl.
CPC .... *H01L 29/7926* (2013.01); *H01L 21/28282* (2013.01); *H01L 23/528* (2013.01); *H01L 23/5226* (2013.01); *H01L 27/1157* (2013.01); *H01L 27/11565* (2013.01)

(58) Field of Classification Search
CPC ......... H01L 27/11563–27/1157; H01L 29/792; H01L 29/7926
See application file for complete search history.

(56) References Cited

U.S. PATENT DOCUMENTS

| | | | |
|---|---|---|---|
| 6,363,012 B1 | 3/2002 | Lin | |
| 6,391,719 B1 | 5/2002 | Lin | |
| 2004/0262668 A1 | 12/2004 | Wang | |
| 2014/0159114 A1* | 6/2014 | Zheng | ............... H01L 29/66833 257/192 |

* cited by examiner

*Primary Examiner* — Julio J Maldonado
*Assistant Examiner* — Molly Reida
(74) *Attorney, Agent, or Firm* — Winston Hsu

(57) ABSTRACT

A vertical flash memory includes a plurality of vertical memory cells, wherein each of the vertical memory cells includes a selective gate, a main gate, a dielectric interlayer and a vertical channel layer. The selective gate is disposed on a substrate. The main gate is stacked on the selective gate. The dielectric interlayer isolates the main gate from the selective gate. The vertical channel layer is disposed on sidewalls of the selective gate and the main gate. The present invention also provides a method of forming said vertical flash memory.

11 Claims, 7 Drawing Sheets

VERTICAL FLASH MEMORY AND FORMING METHOD THEREOF

BACKGROUND OF THE INVENTION

1. Field of the Invention

The present invention relates generally to a flash memory and forming method thereof, and more specifically to a vertical flash memory and forming method thereof.

2. Description of the Prior Art

Microprocessor systems are able to handle data and arrange information and have become an important asset in information development of the highly developed modern information society. One of the most important structures in each kind of microprocessor system is the memory used to store digital data and to provide stored data for microprocessor systems. A flash memory, thanks to electron operation, is able to store data in a non-volatile way and to read the stored data quickly and efficiently, unlike optical or magnetic storage media (such as discs or optical discs). Therefore, flash memories with light volumes and convenient and efficient operations have been utilized widely in various microprocessor systems, such as application chip systems, mobile phones, personal digital assistants, personal computers, digital cameras, etc.

A flash memory consists of MOS transistors with a charge trapping layer, each serving as a memory cell for recording a bit data. A typical memory transistor in addition to a body, a drain, a source, and a main gate as well as a typical MOS transistor, has a charge trapping layer. The charge trapping layer is located in an oxide layer, isolated from the body, the drain, the source, and the main gate. When storing data, proper bias voltages are required to be applied to the gate, the source, the drain, and the body so that the electrons can pass through the oxide layer and thus flow into the charge trapping layer. A different amount of charges injected into the charge trapping layer of the transistor corresponds to different data. For instance, if more charges are injected into the charge trapping layer, the transistor stores a data bit "1"; on the contrary, if fewer charges are injected into the charge trapping layer, the transistor stores a data bit "0". The amount of charges injected into the charge trapping layer will influence the threshold voltage of the transistor. The more negative charges are injected into the charge trapping layer of the transistor, the smaller the absolute value of the threshold voltage of the transistor is. Under the circumstance of keeping the control voltage applied on the main gate, the more negative charge within the charge trapping layer is, the higher the conduct performance associated with the transistor is, so that the current between the source and drain of the transistor is greater. In other words, under the circumstance of keeping the control voltage applied on the main gate, the data bit stored in the transistor depends on the amount of conduct current in the transistor between its source and drain. While overwriting or erasing the original data stored in the memory transistor, the main gate, the body, the drain, and the source are required to have proper bias voltages applied, causing the electrons within the charge trapping layer to pass through the oxide layer and flow into other electrodes of the transistor.

SUMMARY OF THE INVENTION

The present invention provides a vertical flash memory and forming method thereof, which has a selective gate and a main gate stacked vertically and a vertical channel layer on sidewalls of the selective gate and the main gate, thereby reducing layout area of the vertical flash memory.

The present invention provides a vertical flash memory including a plurality of vertical memory cells, wherein each of the vertical memory cells includes a selective gate, a main gate, a dielectric interlayer and a vertical channel layer. The selective gate is disposed on a substrate. The main gate is stacked on the selective gate. The dielectric interlayer isolates the main gate from the selective gate. The vertical channel layer is disposed on sidewalls of the selective gate and the main gate.

The present invention provides a method of forming a vertical flash memory including the following step. A bottom isolation structure having a first trench is deposited on a substrate. A first vertical channel layer is formed on a sidewall of the first trench. A selective gate fills in the first trench. A top isolation structure having a second trench is deposited on the bottom isolation structure, wherein the second trench exposes the first trench. A second vertical channel layer is formed on a sidewall of the second trench and is stacked on the first vertical channel layer. A main gate fills in the second trench and is stacked on the selective gate.

According to the above, the present invention provides a vertical flash memory and forming method thereof, which has a selective gate and a main gate stacked from bottom to top. Besides, a vertical channel layer is on sidewalls of the selective gate and the main gate. Hence, the present invention shrinks the layout area of the formed vertical flash memory.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
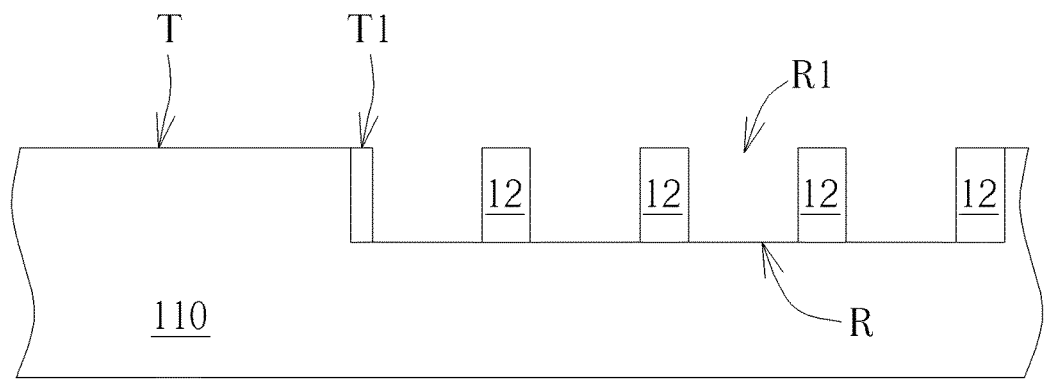
FIG. 1 schematically depicts a cross-sectional view of a method of forming a vertical flash memory according to an embodiment of the present invention.

FIGS. 1-11 schematically depict cross-sectional views of a method of forming a vertical flash memory according to an embodiment of the present invention. As shown in FIG. 1, a substrate 110 having a trench R is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. More precisely, a bulk substrate (not shown) is provided and then is patterned to form the trench R in the substrate 110. A bottom isolation structure 12 having first trenches R1 is formed in the trench R to electrically isolate each later formed vertical memory cell in the first trenches R1. The bottom isolation structure 12 may be composed of oxide, but it is not limited thereto. The bottom isolation structure 12 may be formed in the following. An isolation structure (not shown) is deposited in the trench R and fills up the trench R; the isolation structure may be planarized to remove parts exceeding from the trench R, thereby a top surface of the isolation structure trims a top surface T of the substrate 110; the isolation structure is then patterned by methods such as photolithography and etching processes to form the first trenches R1 in the bottom isolation structure 12, but it is not limited thereto. Therefore, a top surface T1 of the bottom isolation structure 12 trims a top surface T of the substrate 110.

Figure 2:
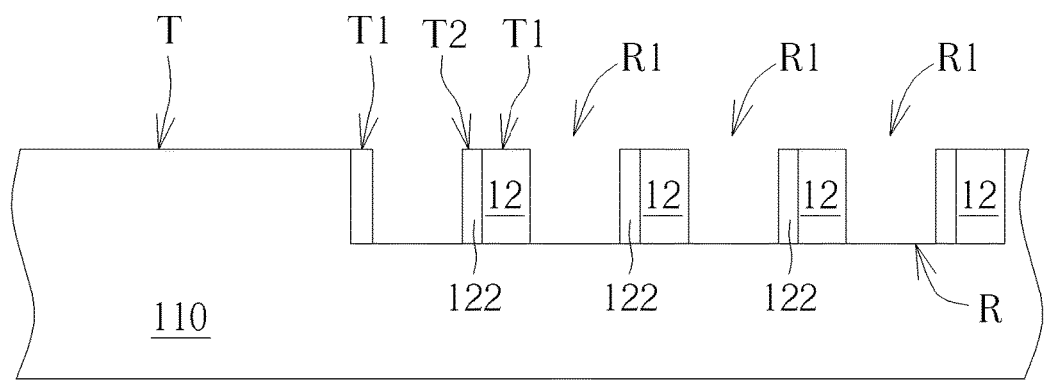
FIG. 2 schematically depicts a cross-sectional view of a method of forming a vertical flash memory according to an embodiment of the present invention.
Figure 3:
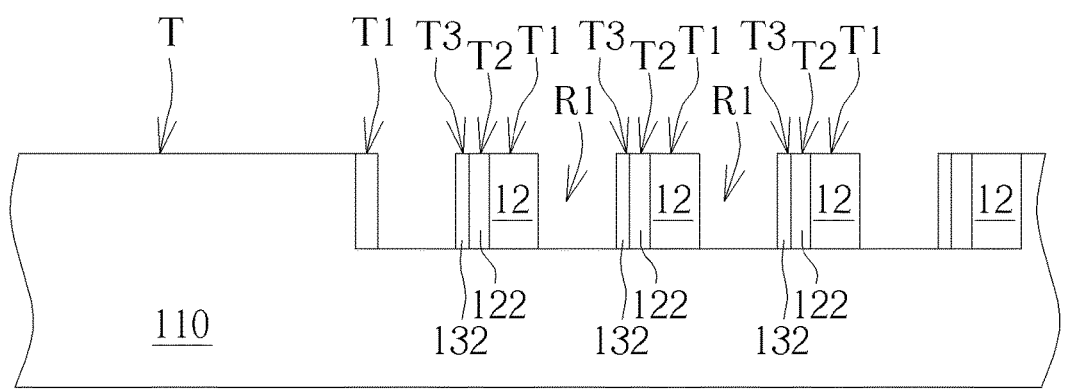
FIG. 3 schematically depicts a cross-sectional view of a method of forming a vertical flash memory according to an embodiment of the present invention.

Please refer to FIGS. 2-3, first vertical channel layers 122 are formed on sidewalls of the first trenches R1 and selective gate dielectric layers 132 are formed on sidewalls of the first vertical channel layers 122 opposite to the bottom isolation structure 12. As shown in FIG. 2, an optional buffer layer (not shown) and a blanket first vertical channel layer (not shown) conformally cover the first trenches R1 and the bottom isolation structure 12 and then a part of the optional buffer layer (not shown) and the blanket first vertical channel layer (not shown) are removed to keep optional buffer layers (not shown) and the first vertical channel layers 122. In this embodiment, the top surface T1 of the isolation structure 12 trims top surfaces T2 of the first vertical channel layers 122. As shown in FIG. 3, a blanket selective gate dielectric layer (not shown) conformally covers the first trenches R1 and the bottom isolation structure 12 and then a part of the blanket selective gate dielectric layer (not shown) is removed to keep the selective gate dielectric layers 132. In this embodiment, the top surface T1 of the bottom isolation structure 12 and the top surfaces T2 of the first vertical channel layers 122 trim top surfaces T3 of the selective gate dielectric layers 132. By doing this, the first vertical channel layers 122 are formed on sidewalls of the first trenches R1 and the selective gate dielectric layers 132 are formed on sidewalls of the first vertical channel layers 122. The method of forming the first vertical channel layers 122 and the selective gate dielectric layers 132 is not restricted thereto. The first vertical channel layers 122 may be pure silicon layers, doped silicon layers or epitaxial layers such as silicon germanium layers or etc. The optional buffer layers (not shown) and the selective gate dielectric layers 132 may be oxide layers, but it is not limited thereto.

Figure 4:
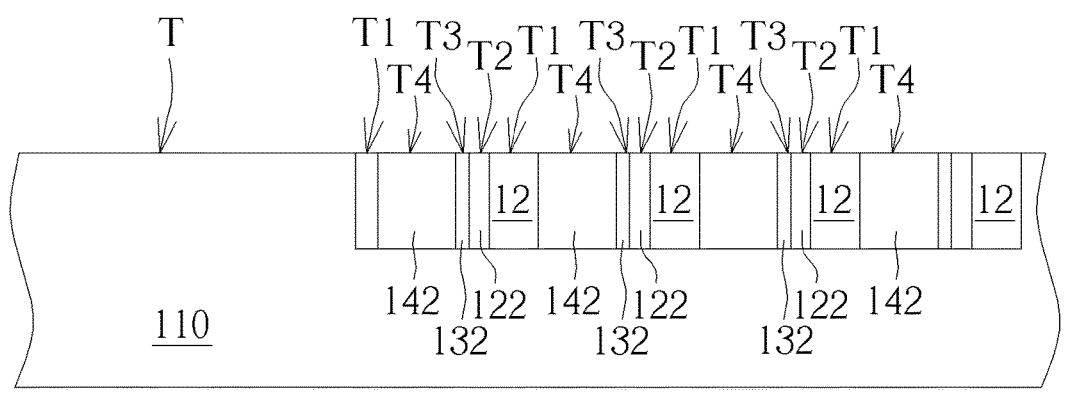
FIG. 4 schematically depicts a cross-sectional view of a method of forming a vertical flash memory according to an embodiment of the present invention.

Then, selective gates 142 fill the first trenches R1, as shown in FIG. 4. The selective gates 142 may be polysilicon gates, but it is not limited thereto. The selective gates 142 may be formed by methods such as a selective gate layer (not shown) is entirely deposited in the first trenches R1 and the bottom isolation structure 12 and then a part of the selective gate layer exceeding from the first trenches R1 is removed to form the selective gates 142. Therefore, the selective gate dielectric layers 132 are sandwiched by the first vertical channel layers 122 and the selective gates 142. In this case, top surfaces T4 of the selective gates 142 trim the top surfaces T1/T2/T3 of the bottom isolation structure 12, the first vertical channel layers 122 and the selective gate dielectric layers 132.

Figure 5:
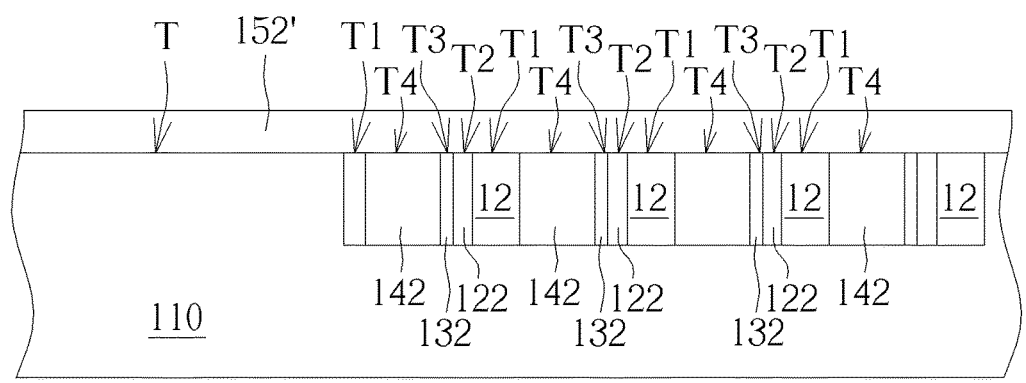
FIG. 5 schematically depicts a cross-sectional view of a method of forming a vertical flash memory according to an embodiment of the present invention.
Figure 6:
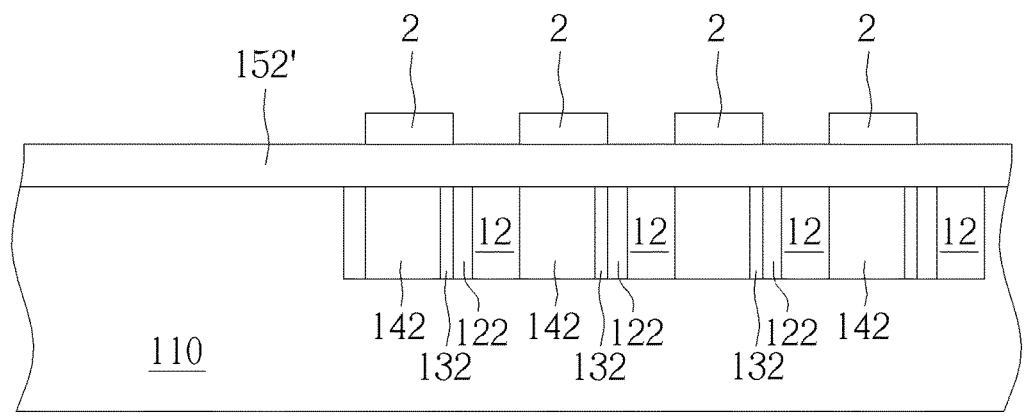
FIG. 6 schematically depicts a cross-sectional view of a method of forming a vertical flash memory according to an embodiment of the present invention.
Figure 7:
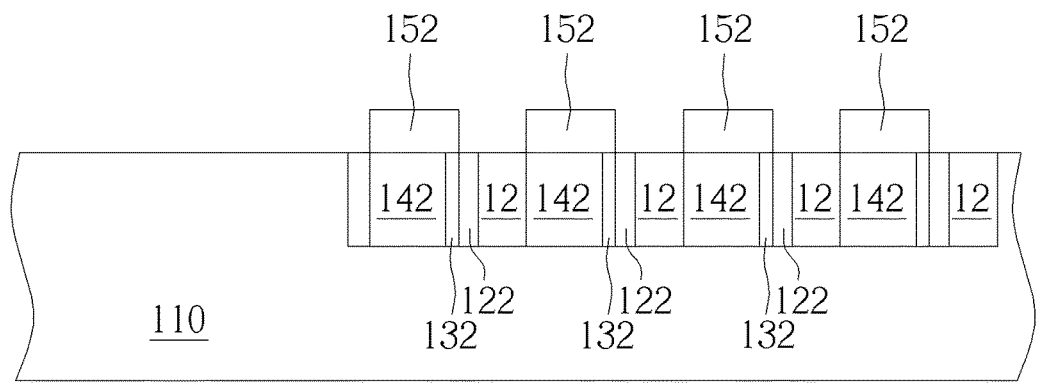
FIG. 7 schematically depicts a cross-sectional view of a method of forming a vertical flash memory according to an embodiment of the present invention.

Please refer to FIGS. 5-7, dielectric interlayers 152 are deposited to overlay the selective gates 142. As shown in FIG. 5, a dielectric layer 152' is deposited to entirely cover the first vertical channel layers 122, the selective gate dielectric layers 132, the selective gates 142 and the bottom isolation structure 12. As shown in FIG. 6, a patterned photoresist 2, which may be formed by depositing and patterning a photoresist, may be formed to only cover the selective gate dielectric layers 132 and the selective gates 142 and to expose the first vertical channel layers 122 and the bottom isolation structure 12 in this embodiment. Then, the part of the dielectric layer 152' exposed by the patterned photoresist 2 is removed (or the dielectric layer 152' is patterned to remove the part of the dielectric layer 152' exposed by the patterned photoresist 2), thereby the dielectric interlayers 152 are formed. In this case, the dielectric interlayers 152 only overlay the selective gates 142 and the selective gate dielectric layers 132, but it is not limited thereto.

Figure 8:
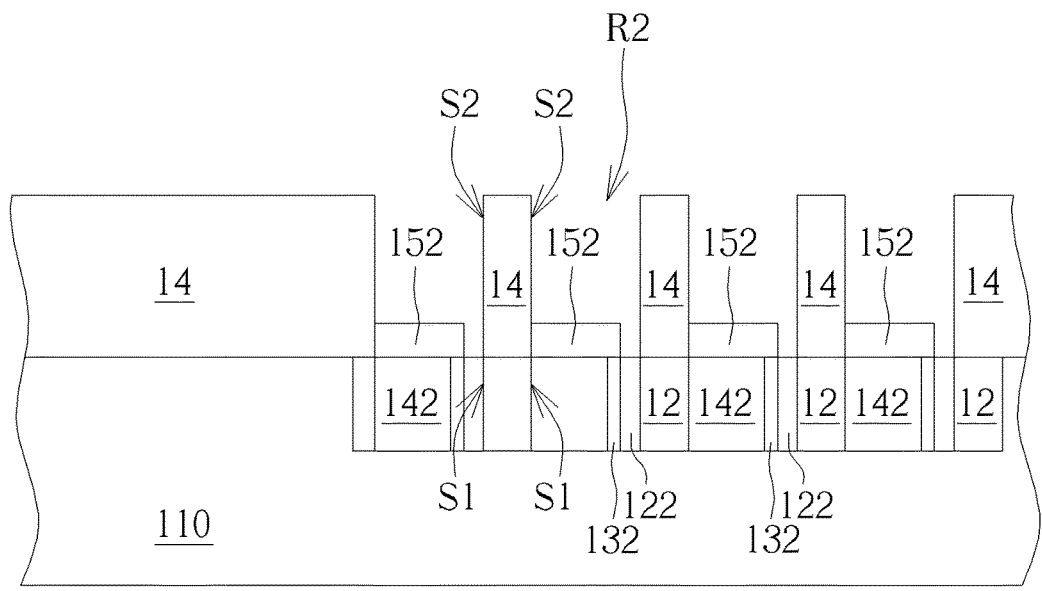
FIG. 8 schematically depicts a cross-sectional view of a method of forming a vertical flash memory according to an embodiment of the present invention.

As shown in FIG. 8, a top isolation structure 14 having second trenches R2 are deposited on the bottom isolation structure 12 and the second trenches R2 expose the first trenches R1 as shown in FIG. 1. That is, the top isolation structure 14 is stacked on the bottom isolation structure 12. The top isolation structure 14 may be formed by depositing an isolation structure (not shown) entirely covering the substrate 110, the bottom isolation structure 12, the first vertical channel layers 122, the selective gate dielectric layers 132 and the selective gates 142 and then patterning the isolation structure (not shown) to expose the first trenches R1 of FIG. 1, but it is not limited thereto. In this case, sidewalls S1 of the bottom isolation structure 12 trim sidewalls S2 of the top isolation structure 14, but it is not limited thereto.

Figure 9:
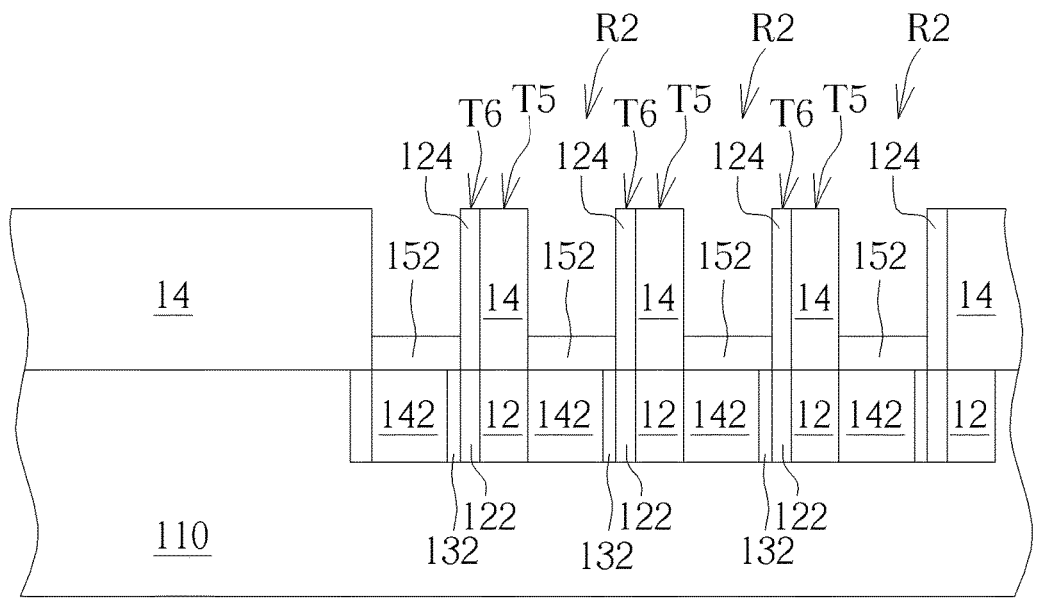
FIG. 9 schematically depicts a cross-sectional view of a method of forming a vertical flash memory according to an embodiment of the present invention.
Figure 10:
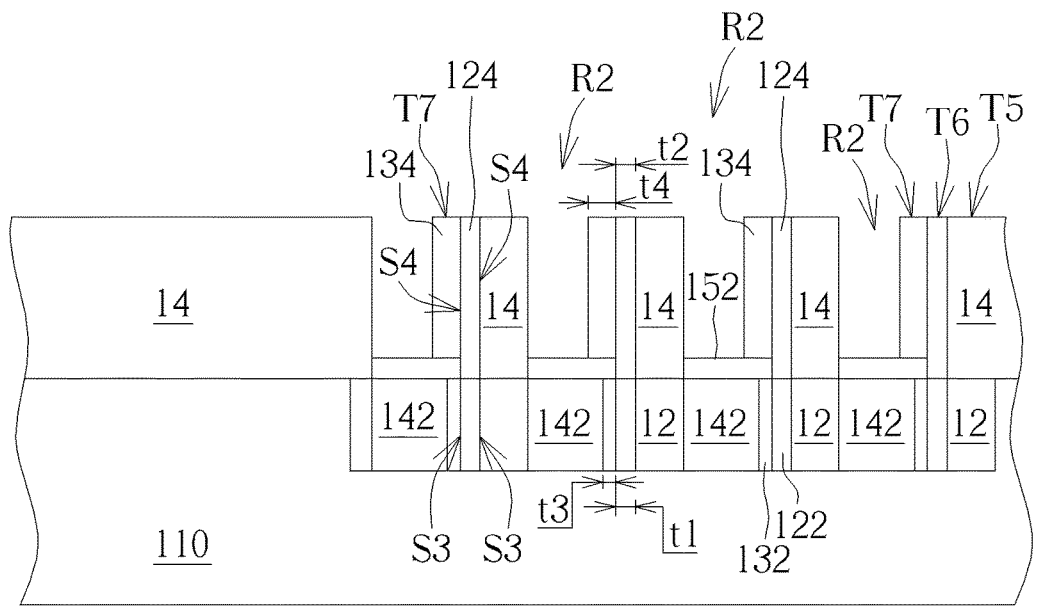
FIG. 10 schematically depicts a cross-sectional view of a method of forming a vertical flash memory according to an embodiment of the present invention.

Please refer to FIGS. 9-10, second vertical channel layers 124 are formed on sidewalls of the second trenches R2 and are stacked on the first vertical channel layers 122, and charge trapping layers 134 are formed on sidewalls of the second vertical channel layers 124 opposite to the top isolation structure 14 and are stacked on the selective gate dielectric layers 132. As shown in FIG. 9, a blanket second vertical channel layer (not shown) may conformally cover the second trenches R2 and the top isolation structure 14 and then a part of the blanket second vertical channel layer (not shown) is removed to keep the second vertical channel layers 124. In this embodiment, a top surface T5 of the top isolation structure 14 trims top surfaces T6 of the second vertical channel layers 124. As shown in FIG. 10, a blanket charge trapping layer (not shown) conformally covers the second trenches R2 and the top isolation structure 14 and then a part of the blanket charge trapping layer (not shown) is removed to keep the charge trapping layers 134. In this embodiment, the top surface T5 of the top isolation structure 14 and the top surfaces T6 of the second vertical channel layers 124 trim top surfaces T7 of the charge trapping layers 134. Therefore, the second vertical channel layers 124 are formed on sidewalls of the second trenches R2 and the charge trapping layers 134 are formed on sidewalls of the second vertical channel layers 124. The method of forming the charge trapping layers 134 and the second vertical channel layers 124 is not restricted thereto. The second vertical channel layers 124 may be pure silicon layers, doped silicon layers or epitaxial layers such as silicon germanium layers or etc. The charge trapping layers 134 may be oxide/nitride/oxide layers, but it is not limited thereto. In this case, sidewalls S3 of the first vertical channel layers 122 trim sidewalls S4 of the second vertical channel layers 124; that is, thicknesses t1 of the first vertical channel layers 122 equal to thicknesses t2 of the second vertical channel layers 124, but it is not limited thereto. In this embodiment, thicknesses t3 of the selective gate dielectric layers 132 are thinner than thicknesses t4 of the charge trapping layers 134.

Figure 11:
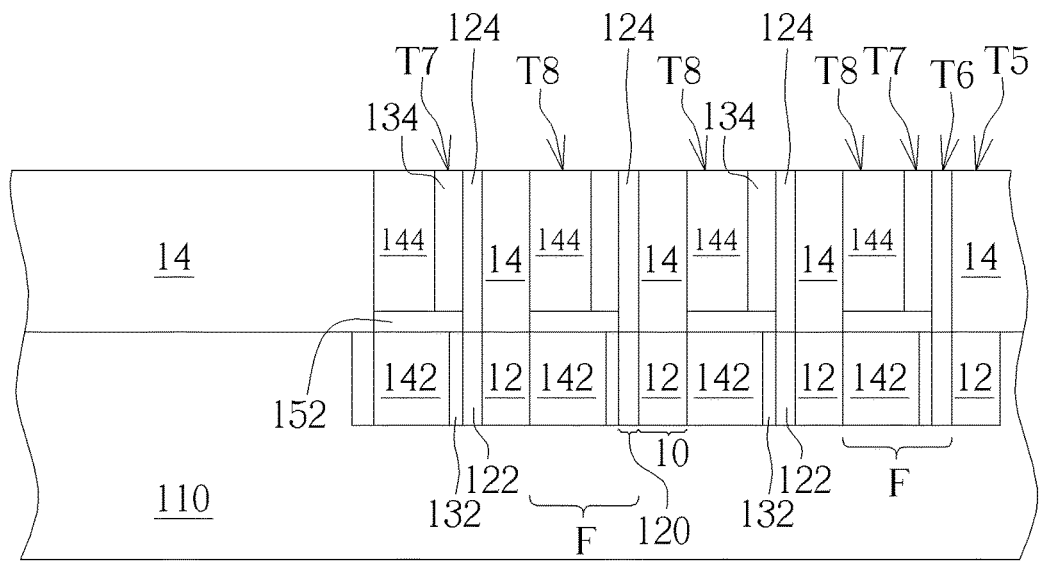
FIG. 11 schematically depicts a cross-sectional view of a method of forming a vertical flash memory according to an embodiment of the present invention.

Then, main gates 144 fill the second trenches R2, as shown in FIG. 11. The main gates 144 may be polysilicon gates, but it is not limited thereto. The main gates 144 may be formed by methods such as a main gate layer (not shown) is entirely deposited in the second trenches R2 and the top isolation structure 14 and then a part of the main gate layer exceeding from the second trenches R2 is removed to form the main gates 144. Therefore, the charge trapping layers 134 are sandwiched by the second vertical channel layer 124 and the main gates 144. In this case, top surfaces T8 of the main gates 144 trim the top surfaces T5/T6/T7 of the top isolation structure 14, the second vertical channel layers 124 and the charge trapping layers 134.

Above all, the dielectric interlayers 152 isolate the main gates 144 from the selective gates 142. Each of the first vertical channel layer 122 and the corresponding second vertical channel layer 124 constitute a vertical channel layer 120, wherein the vertical channel layer 120 includes the first vertical channel layer 122 and the second vertical channel layer 124 stacked from bottom to top. Each of the bottom isolation structure 12 and the corresponding top isolation structure 14 constitute an isolation structure 10, wherein the isolation structure 10 includes the bottom isolation structure 12 and the top isolation structure 14 stacked from bottom to top. The isolation structure 10 isolates the vertical memory cells F from each other.

Figure 12:
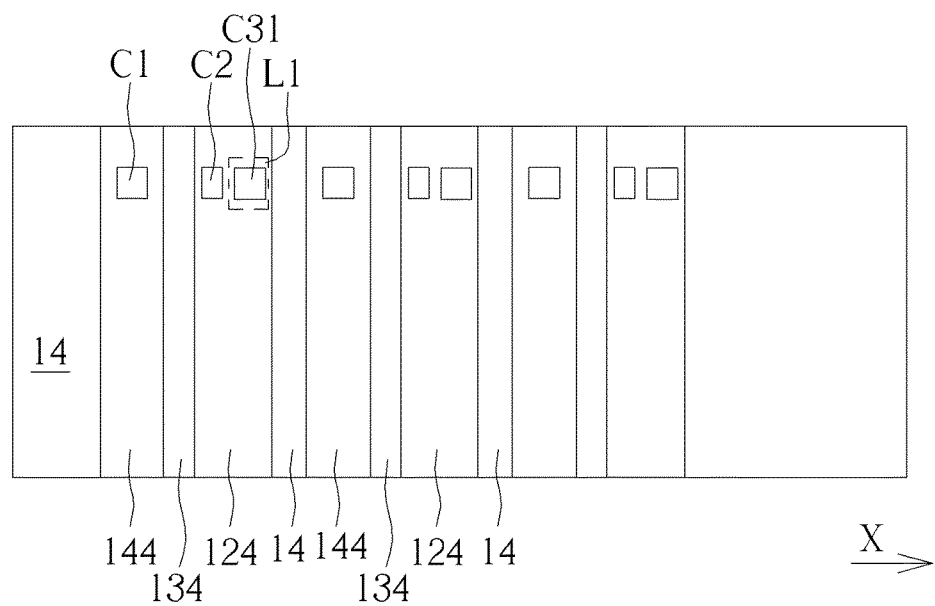
FIG. 12 schematically depicts a top view of a method of forming a vertical flash memory according to an embodiment of the present invention.
Figure 13:
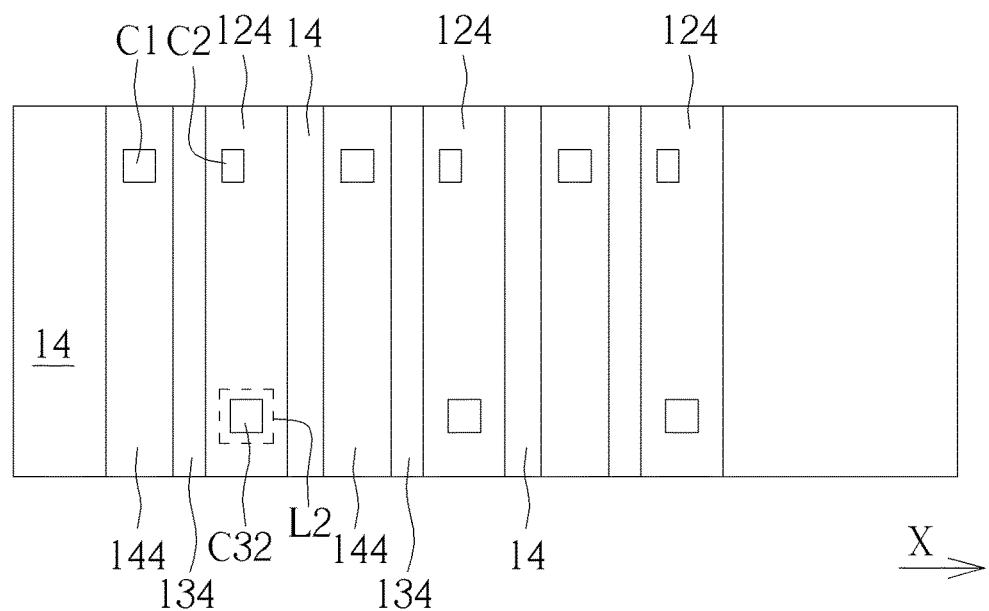
FIG. 13 schematically depicts a top view of a method of forming a vertical flash memory according to another embodiment of the present invention.
Figure 14:
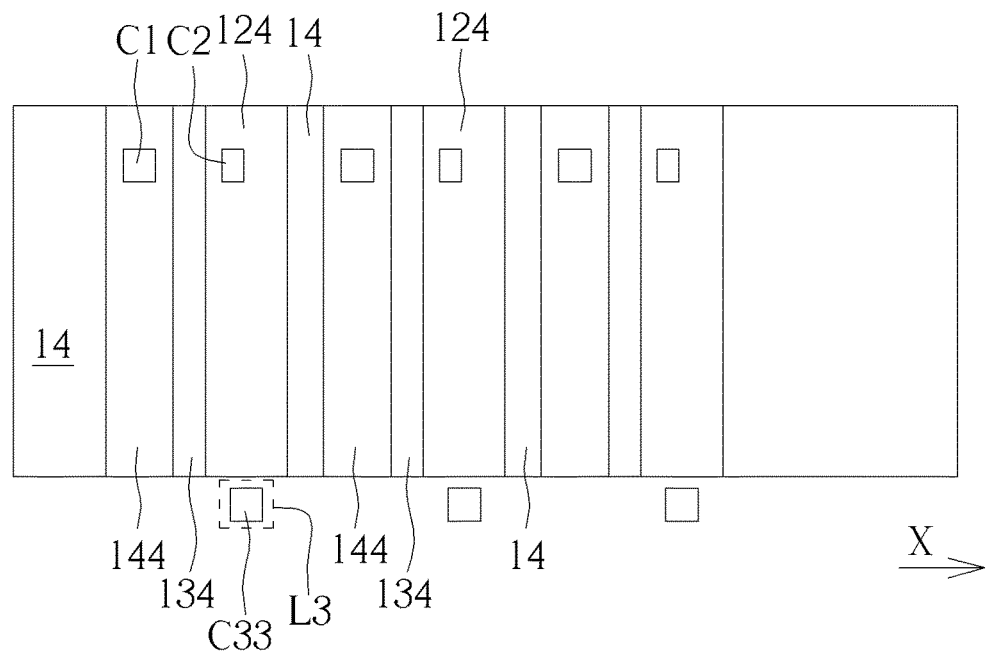
FIG. 14 schematically depicts a top view of a method of forming a vertical flash memory according to another embodiment of the present invention.

Then, each contact C1 directly contacts each of the main gates 144, each source line contact C2 directly contacts each second vertical channel layer 124 and each bit line contact C31/C32/C33 directly contacts each bit line contact region L1/L2/L3. FIGS. 12-14 respectively depict top views of a method of forming a vertical flash memory according to three embodiments of the present invention, wherein the bit line contact regions L1/L2 are included in the second vertical channel layers 124 as shown in FIGS. 12-13 or are beside the second vertical channel layers 124 as shown in FIG. 14. As shown in FIG. 12, each of the bit line contact regions L1 (or each of the bit line contacts C31) is included in each of the second vertical channel layers 124, and each of the bit line contact regions L1 (or each of the bit line contacts C31) overlaps the source line contacts C2 in one same second vertical channel layer 124. As shown in FIG. 13, each of the bit line contact regions L2 (or each of the bit line contacts C32) is included in each of the second vertical channel layers 124, but the bit line contact region L2 (or the bit line contact C32) misaligns the source line contact C2 in one same second vertical channel layer 124. As shown in FIG. 14, each of the bit line contact regions L3 (or each of the bit line contacts C33) is beside each of the second vertical channel layer 124.

To summarize, the present invention provides a vertical flash memory and forming method thereof, which has a selective gate and a main gate stacked from bottom to top with a dielectric interlayer separating both of them. Besides, a vertical channel layer is on sidewalls of the selective gate and the main gate. Hence, the present invention shrinks the layout area of the formed vertical flash memory.

Moreover, the vertical channel layer includes a first vertical channel layer and a second vertical channel layer stacked from bottom to top. A selective gate dielectric layer is sandwiched by the first vertical channel layer and the selective gate, while a charge trapping layer is sandwiched by the second vertical channel layer and the main gate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A vertical flash memory, comprising:
   a plurality of vertical memory cells, wherein each of the vertical memory cells comprises:
   a selective gate disposed on a substrate;
   a main gate stacked on the selective gate;
   a dielectric interlayer isolating the main gate from the selective gate;
   a vertical channel layer disposed on sidewalls of the selective gate and the main gate; and
   an isolation structure directly contacting a sidewall of the vertical channel layer opposite to the selective gate and the main gate.

2. The vertical flash memory according to claim 1, further comprising:
   a selective gate dielectric layer disposed between the selective gate and the vertical channel layer.

3. The vertical flash memory according to claim 2, further comprising:
   a charge trapping layer disposed between the main gate and the vertical channel layer, and the charge trapping layer stacked on the selective gate dielectric layer.

4. The vertical flash memory according to claim 3, wherein the charge trapping layer and the selective gate dielectric layer are separated by the dielectric interlayer.

5. The vertical flash memory according to claim 1, further comprising:
   a contact directly contacting the main gate while a source line contact directly contacts the vertical channel layer and a bit line contact directly contacts a bit line contact region.

6. The vertical flash memory according to claim 5, wherein the bit line contact region is included in the vertical channel layer, wherein the source line contact and the bit line contact are misaligned.

7. The vertical flash memory according to claim 5, wherein the bit line contact region is beside the vertical channel layer.

8. The vertical flash memory according to claim 1, wherein the vertical channel layer comprises a first vertical channel layer and a second vertical channel layer stacked from bottom to top.

9. The vertical flash memory according to claim 8, wherein a top surface of the first vertical channel layer trims a top surface of the selective gate, and a top surface of the second vertical channel layer trims a top surface of the main gate.

10. The vertical flash memory according to claim 1, wherein the isolation structure isolates the vertical memory cells from each other.

11. The vertical flash memory according to claim 10, wherein the isolation structure comprises a bottom isolation structure and a top isolation structure stacked from bottom to top, wherein a top surface of the bottom isolation structure trims a top surface of the selective gate, and a top surface of the top isolation structure trims a top surface of the main gate.

\* \* \* \* \*